United States Patent
Beele

(10) Patent No.: US 6,387,526 B1
(45) Date of Patent: *May 14, 2002

(54) THERMAL BARRIER LAYER AND PROCESS FOR PRODUCING THE SAME

(75) Inventor: Wolfram Beele, Ratingen (DE)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/952,438

(22) Filed: Sep. 13, 2001

Related U.S. Application Data

(63) Continuation of application No. 09/329,760, filed on Jun. 10, 1999, now Pat. No. 6,319,614, which is a continuation of application No. PCT/DE97/02769, filed on Nov. 26, 1997.

(30) Foreign Application Priority Data

Dec. 10, 1996 (DE) .......................... 196 51 273

(51) Int. Cl.⁷ .......................... B32B 15/00; B32B 9/00; C23C 4/10
(52) U.S. Cl. .......................... 428/469; 428/472; 428/697; 428/699; 428/701; 428/702; 427/453; 416/241 B; 416/241 R
(58) Field of Search .......................... 428/469, 472, 428/697, 699, 701, 702, 615, 623, 629, 632, 633; 427/453; 416/241 R, 241 B

(56) References Cited

U.S. PATENT DOCUMENTS

| | | | |
|---|---|---|---|
| 4,321,310 A | * | 3/1982 | Ulion et al. |
| 4,321,311 A | * | 3/1982 | Strangman |
| 4,676,994 A | * | 6/1987 | Demaray |
| 4,764,341 A | * | 8/1988 | Flaitz et al. |
| 4,880,614 A | * | 11/1989 | Strangman et al. |
| 5,238,752 A | * | 8/1993 | Duderstadt et al. |
| 5,262,245 A | * | 11/1993 | Ulion et al. |
| 5,683,825 A | * | 11/1997 | Bruce et al. |
| 5,805,973 A | * | 9/1998 | Coffinberry et al. |

* cited by examiner

Primary Examiner—Deborah Jones
Assistant Examiner—Jennifer McNeil

(57) ABSTRACT

A device operable in a temperature environment in excess of about 1250° C. is provided. The device comprises a substrate and a ceramic thermal barrier layer deposited on at least a portion of the substrate. The layer is formed with a ternary or pseudoternary oxide having a pyrochlore structure of the formula $A_2B_2O_7$ and having pores or other voluminous defects.

21 Claims, 2 Drawing Sheets

THERMAL BARRIER LAYER AND PROCESS FOR PRODUCING THE SAME

This application is a continuation of U.S. application Ser. No. 09/329,760, filed Jun. 10, 1999, now U.S. Pat. No. 6,319,614 which was a continuation of International Application No. PCT/DE97/02769, filed Nov. 26, 1997, which designated the United States and which claimed priority to Federal Republic of Germany Application No. 19651273.5, filed Dec. 10, 1996.

BACKGROUND OF THE INVENTION

FIELD OF THE INVENTION

The invention relates to a ceramic-coated product, in particular a ceramic coated component, for use in a hot gas duct, especially in industrial gas turbines. The invention furthermore relates to a process for producing a product having a thermal barrier layer.

A product of that type has a base body of a metal alloy based on nickel, cobalt or iron. Products of that type are primarily used as a component of a gas turbine, in particular as gas turbine blades or heat shields. The components are exposed to a hot gaseous flow of aggressive combustion gases. They must therefore be capable of withstanding very heavy thermal stresses. It is furthermore necessary for those components to be resistant to oxidation and corrosion.

Primarily for moving components, e.g. gas turbine blades, but also for static components, there are also mechanical requirements. The power and the efficiency of a gas turbine in which components that can be subjected to hot gas are used, rise with increasing operating temperature. In order to achieve high efficiency and high power, those parts of the gas turbines which are especially subjected to the high temperatures are coated with a ceramic material. The latter acts as a thermal barrier layer between the hot gas flow and the metallic substrate.

The metallic base body is protected from the aggressive hot gas flow by coatings. That being the case, modern components usually have a plurality of coatings, each of which fulfills specific requirements. A multilayer system is thus involved.

Since the power and efficiency of gas turbines rise with increasing operating temperature, efforts are constantly being made to achieve higher gas turbine performance by improving the coating system.

A first approach with a view to this improvement is in optimizing the adhesion layer. U.S. Pat. No. 4,321,310 discloses the application of an MCrAlY adhesion layer in such a way that it has a low degree of surface roughness. A layer of aluminum oxide is then formed thereon in order to achieve thereby a substantial improvement in the adhesion of the thermal barrier layer U.S. Pat. No. 4,880,614 discloses incorporation of a high-purity aluminum layer between the MCrAlY adhesion layer and the metallic base body. That aluminum is used to form a dense $Al_2O_3$ layer on the adhesion layer in order to increase the life of the coated component.

U.S. Pat. No. 5,238,752 discloses an adhesion layer of nickel aluminides or platinum aluminides. A layer of aluminum oxide is formed on that adhesion layer. The thermal barrier layer is applied thereon.

U.S. Pat. No. 5,262,245 discloses that the aluminum oxide layer is formed as an oxidation layer from the material of the base body. For that purpose, the base body has a nickel-based alloy which has strongly oxide-forming alloy constituents.

U.S. Pat. No. 4,676,994 discloses the application of a layer that forms aluminum oxide to a base body. Aluminum oxide is formed on the surface of this layer. A dense ceramic layer is applied thereon by evaporation coating. This ceramic layer is formed of a dense substoichiometric ceramic material. It may be an oxide, nitride, carbide, boride, silicide or a different refractory ceramic material. A thermal barrier layer is applied to that ceramic layer.

The great majority of the above U.S. patents indicate that the thermal barrier layer has a columnar microstructure in which the crystallite columns of the columnar microstructure extend perpendicular to the surface of the base body. Stabilized zirconium oxide is indicated as the ceramic material. Suitable stabilizers include calcium oxide, magnesium oxide, cerium oxide and, preferably, yttrium oxide. The stabilizer is needed in order to prevent a phase transition from the cubic to the tetragonal and then monoclinic crystal structure. In essence, the tetragonal phase is stabilized to about 90%.

In U.S. Pat. No. 4,321,311, voluminous defects are provided in the thermal barrier layer in order to reduce stresses which are produced in the thermal barrier layer when the temperature changes, as a result of the fact that the base body and the thermal barrier layer have different coefficients of thermal expansion. The thermal barrier layer has a columnar structure with gaps between the individual columns of the coating of zirconium oxide stabilized with yttrium oxide.

Another proposal for solving the problem of stress when confronted with temperature variation is indicated in U.S. Pat. No. 5,236,787. There, an intermediate layer of a metal/ceramic mixture is interposed between the base body and the thermal barrier, in which the metallic proportion of this intermediate layer increases in the direction of the base body and to decrease in the direction of the thermal barrier layer. Conversely, the ceramic proportion should be low close to the base body and high close to the thermal barrier layer. The thermal barrier layer proposed is a zirconium oxide stabilized with yttrium oxide and having some proportion of cerium oxide. The thermal barrier layers are deposited on the base body by plasma spraying or PVD methods. The proportion of the yttrium oxide stabilizer is from 8 to 20% by weight.

U.S. Pat. No. 4,764,341 discloses the bonding of a thin metal layer to a ceramic. Nickel, cobalt, copper and alloys of these metals are used for the metal layer. In order to bond the metal layer to the ceramic substrate, an intermediate oxide such as aluminum oxide, chromium oxide, titanium oxide or zirconium oxide is applied to the ceramic substrate. At a sufficiently high temperature, this intermediate oxide forms a ternary oxide through oxidation by incorporating an element from the metallic coating.

SUMMARY OF THE INVENTION

It is accordingly an object of the invention to provide a product to be exposed to a hot gas and having a base body of metal and bonded thereto a thermal barrier layer, and a process for producing the same, which overcome the disadvantages of the heretofore-known products and processes of this general type.

With the foregoing and other objects in view there is provided, in accordance with the invention, a product to be exposed to a hot gas and having a metallic base body to which a ceramic thermal barrier layer formed with a ternary or pseudoternary oxide, is bonded, in which said oxide has a pyrochlore crystal structure of the structure formula $A_2B_2O_7$.

With the objects of the invention in view, there is also provided a product to be exposed to a hot gas and having a metallic base body to which a ceramic thermal barrier layer formed with a ternary or pseudoternary oxide, is bonded, in which that oxide has a perovskite crystal structure of the structure formula $ABO_3$ in which A is calcium or ytterbium, and when A is calcium, B is hafnium and when A is ytterbium, B is at least one of zirconium and hafnium.

The invention is based on the fact that, until now, materials for thermal barrier layers have predominantly been pseudobinary ceramics, that is ceramic materials having a general structural formula which can be represented as $AB_2$ or $A_2B_3$. In this case, a material based on zirconium oxide has proved most advantageous. However, from as little as 900° C., zirconium oxide displays evidence of aging. This is caused by the zirconium oxide thermal barrier layer sintering. As a result, the pores and the voluminous defects in the thermal barrier layer undergo progressive diminishment, and the stresses caused by the different thermal expansion coefficients of the material forming the thermal barrier layer and the material forming the base body are reduced less and less well. This sintering process is reinforced by material impurities. It is further reinforced by the interaction of the thermal barrier layer with hot gas constituents, with materials in the base body and the material of the adhesion layer. Above all, the yttrium oxide used as a stabilizer promotes aging. Since it is desirable to have a long service life of gas turbines operating under full load, for example 10,000 hours, the permissible surface temperature of components having thermal barrier layers made of zirconium oxide is limited to 1250° C. This maximum permissible surface temperature dictates and limits the power and efficiency of gas turbines.

According to the invention, in contrast thereto, the product has a ceramic thermal barrier layer with a ternary or pseudoternary oxide. The oxide preferably has a pyrochlore or perovskite structure as defined. The material of the thermal barrier layer preferably has no phase transition from room temperature to its melting temperature. It is then not necessary to add a stabilizer. The melting temperature depends on the respective chemical compound and is preferably above 2150° C.

According to a particular feature of the invention, a bonding layer having a bonding oxide is disposed between the base body and the thermal barrier layer. This layer can, for example, be produced by applying an oxide. Preferably, however, the bonding layer forms an adhesion promoter layer by oxidation, which adhesion promoter layer is disposed between the thermal barrier layer and the base body. The oxidation of the adhesion promoter layer can take place before application of the thermal barrier layer, or alternatively during use of the product in an oxygen-containing atmosphere. In this case, the adhesion promoter layer preferably contains a metallic element that forms an oxide. It is likewise possible for the bonding layer to be formed directly by oxidation of the alloy of the metallic base body. For this purpose, the alloy of the base body has a corresponding metallic element. The bonding oxide is preferably chromium oxide and/or aluminum oxide.

According to a further feature of the invention, the product is preferably a component of a heat engine, for example a gas turbine blade, a heat shield part of a combustion chamber of a gas turbine or a component of a combustion engine. Such gas turbine components, e.g. turbine blades or heat shields, preferably have a base body which is formed of a superalloy based on nickel, chromium or iron. On this base body there is, in particular, an MCrAlY adhesion promoter layer. It also serves as an oxidation protection layer since, in air or virtually any other oxygen-containing environment (i.e. at least when the component is used, if not earlier) part of the aluminum and/or chromium is converted into oxide. On this adhesion promoter layer is the thermal barrier layer which is formed of a ternary or pseudoternary oxide having a pyrochlore or perovskite structure. The term ternary oxide defines a substance which is formed of atoms of three different chemical elements. The term pseudoternary oxide defines a substance which contains atoms of more than three different chemical elements, but these atoms belong to only three different element groups, the atoms of the individual elements in each of the three different element groups being equivalent in terms of crystallography.

These ceramic substances have the low thermal conductivity required of thermal barrier layers. The thermal conductivity is, in particular at higher temperatures, comparable with that of zirconium oxide. Furthermore, the ceramic substances of the thermal barrier layer have a coefficient of thermal expansion which is compatible with the coefficient of thermal expansion of the material of the base body. The coefficient of thermal expansion is about $9 \times 10^{-6}$/K. The ceramic substances of the thermal barrier layer which contain ternary oxides are preferably phase stable between room temperature and melting temperature. This obviates the need for a stabilizer, whose presence promotes aging. They are furthermore sure to adhere stably to the base body through the use of the MCrAlY adhesion promoter layer. It should furthermore be emphasized that the rates of evaporation of the ceramic substances of the thermal barrier layer are very low. As an order of magnitude, for example, the evaporation rate of lanthanum hafnate is 0.4 $\mu$m per 1000 hours at 1600° C.

With the objects of the invention in view, there is additionally provided a process for applying the thermal barrier layers in which the coating takes place with a ternary oxide, in particular a pyrochlore ceramic through atmospheric plasma spraying or a PVD method, for example an EB-PVD (Electron Beam Physical Vapor Deposition) method. In the case of both methods, a layer having the desired porosity can be introduced by suitable choice of the process parameters. It is also possible to produce a columnar microstructure. It is in this case not absolutely necessary for the starting material used for the coating to already have the same chemical and crystallographic composition as the material of the finished coating. Above all in the case of the lanthanum hafnate, it is possible to use a powder mixture, being formed of two binary oxides, for the starting material of the coating process. The mass ratio of the two powders corresponds in this case to the stoichiometric composition of the thermal barrier layer then formed on the component by the coating process. By way of example, a thermal barrier layer made of lanthanum hafnate can be produced by using a mixture of hafnium oxide and lanthanum oxide as starting material in an EB-PVD process. In this case, the molar ratio of hafnium oxide to lanthanum oxide is 1.29.

Other features which are considered as characteristic for the invention are set forth in the appended claims.

Although the invention is illustrated and described herein as embodied in a product to be exposed to a hot gas and having a thermal barrier layer, and a process for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and

DESCRIPTION OF THE PREFERRED EMBODIMENTS

Referring now to the figures of the drawings in detail, it is noted that in a thermal barrier layer made of a ceramic substance being formed of a ternary oxide having pyrochlore structure, the crystal structure has 88 atoms per unit cell. The general chemical structural formula of ternary oxides of this type is $A_2B_2O_7$, in which "A" and "B" are metal ions and "O" is oxygen.

Figure 1:
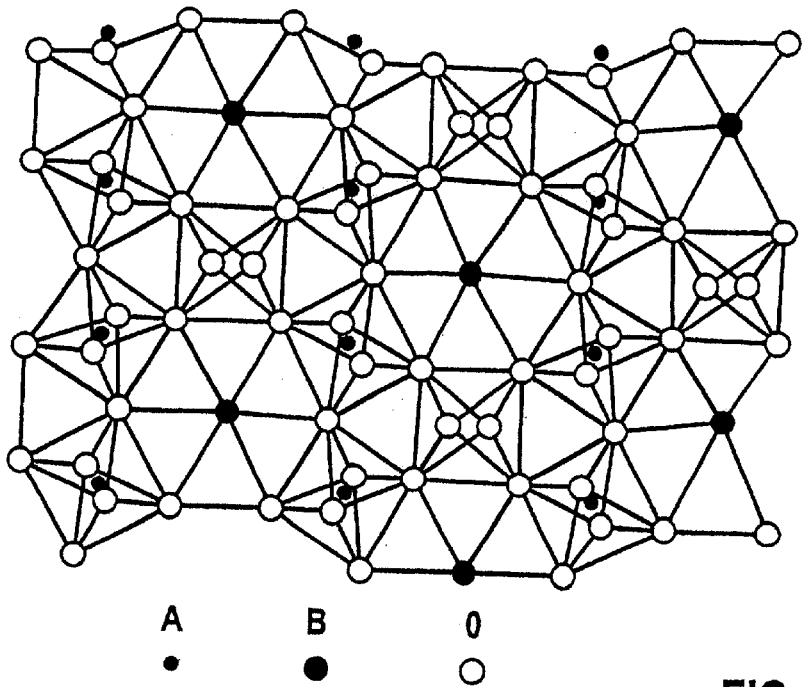
FIG. 1 is a plan view of a plane of a pyrochlore structure.

The pyrochlore structure is described below with regard to FIG. 1. The relatively small B cations coordinate with oxygen atoms in the form of an octahedron. These octahedra form a three-dimensional network in which the neighboring octahedra each share an oxygen atom. The relatively large A cations in this case are situated in a hexagonal ring formed by the oxygen atoms of the coordination octahedra of the B cations. At right angles to the surface of the ring, above and below the respective A cation, there is an oxygen atom having a bond length which in this case is somewhat shorter than the bond length to the oxygen atoms of the ring. An A cation therefore coordinates with oxygen in the form of a hexagonal double pyramid.

Figure 2:
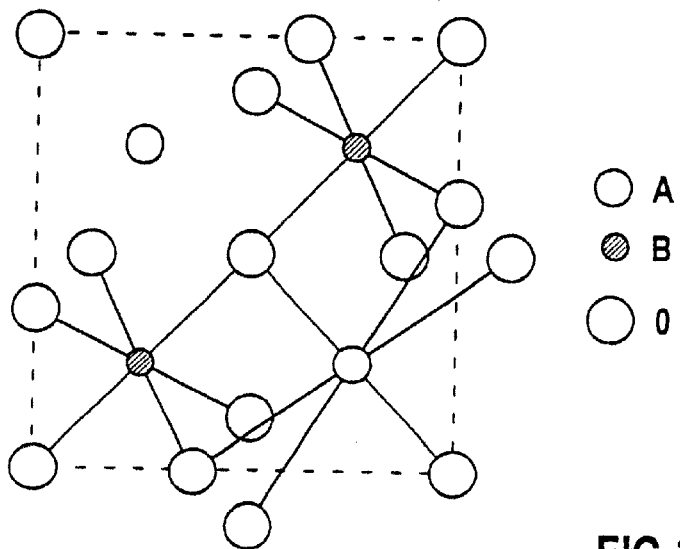
FIG. 2 is a view of a portion of an elementary cell of a pyrochlore structure.

Another description of the pyrochlore structure shown in FIG. 2 is that the structure is composed of two types of coordination polyhedra for the cations. In this case, six equidistant oxygen atoms in the form of trigonal antiprisms coordinate the relatively small B cations. The larger A cation is coordinated by six equidistant oxygen atoms and two additional oxygen atoms with somewhat shorter bond length.

These eight oxygen atoms form a twisted cube around the A cation.

Difficulties arise in describing the structure, in particular because the coordination polyhedra become distorted when there are different bond lengths between the cations and oxygen atoms, depending on which chemical elements are actually present for the A and B cations. It therefore seems that powder diffractometry measurements do not permit reliable conclusions regarding mutual coordination of the various atoms. To this extent, it is necessary and, for characterizing the polychlore structure, it is sufficient to characterize it through the use of the 2θ values from the powder diffractometry measurement. The following table gives the 2θ values for intensities characteristic of polychlore, and the associated hkl values.

| 2θ | hkl |
|---|---|
| 29.2 | 111 |
| 33.2 | 200 |
| 47.8 | 220 |
| 56.7 | 311 |
| 59.4 | 222 |
| 69.8 | 400 |
| 77.2 | 331 |
| 79.6 | 420 |
| 89.0 | 511/311 |

Due to impurities in the powder which is being examined, slight deviations from the 2θ values may occur in the first decimal place. Systematic errors may also occur in powder diffractometry measurement. Errors of this type can basically affect the measured 2θ values in two ways: on one hand, the measured 2θ values may as a whole be shifted to larger or smaller 2θ values. In this case, however, the difference between two consecutive 2θ values remains the same. On the other hand, it may happen that the intensities as a whole appear stretched or squashed over the 2θ value range. Nevertheless, the ratio of the distances between consecutive 2θ values for the sample which is measured is equal to the ratio of the corresponding distances between consecutive 2θ values in the table given above.

The A and B cations in the general chemical structural formula preferably stand for rare earth metals and aluminum (generally: $A^{3+}$ cations) and hafnium, zirconium and Ce (generally: $B^{4+}$ cations).

In order to provide a thermal barrier layer with a ternary oxide, in particular with pyrochlore structure, the following substances are preferably suitable: lanthanum hafnate ($La_2Hf_2O_7$), lanthanum zirconate ($La_2Zr_2O_7$), aluminum hafnate ($Al_2Hf_2O_7$), cerium hafnate ($Ce_2Hf_2O_7$), cerium zirconate ($Ce_2Zr_2O_7$), aluminum cerate ($Al_2Ce_2O_7$) and lanthanum cerate ($La_2Ce_2O_7$)

Suitable coating materials with pyrochlore structure also include pseudoternary oxides. These can, for example, have the structural formula $La_2(HfZr)O_7$ or $(CeLa)Hf_2O_7$. Compounds having fractional indices can also be considered, for example $La_2(Hf_{1.5}Zr_{0.5})O_7$ It is also possible for both the A ions and the B ions to include a plurality of elements at the same time. These compounds are distinguished in that, in comparison with the elements which constitute them, they have a solubility range of several mol %. The formation of deposits with heavily superstoichiometric or substoichiometric composition is thereby avoided. They are furthermore distinguished in that they are stable with respect to phase over a broad temperature range. This means that the pyrochlore structure is maintained in the temperature range relevant to operation in hot gas ducts. Thus, $La_2Hf_2O_2$ and $La_2Zr_2O_7$ do not change their crystal structure until above 1500° C. This also obviates the need to add a stabilizer. The stabilizer's effect of promoting aging of the material is consequently eliminated, and the permissible operating temperature can consequently be raised to higher values.

Coating materials with a perovskite structure have the general chemical structural formula $ABO_3$. Compounds with perovskite structure differ from those with ilmenite structure, which also have the general chemical formula $ABO_3$, in that the A ions are relatively small compared to the B ions.

Figure 4:
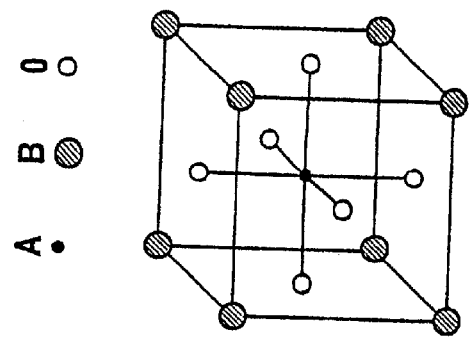
FIG. 4 is a view of a unit cell of the perovskite structure, in which the unit cell has been shifted by ½, ½, ½ relative to the one in FIG. 1.
Figure 3:
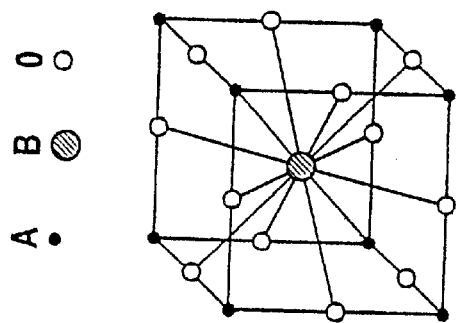
FIG. 3 is a view of a unit cell of a perovskite structure.

Crystallographically, the perovskite structure is described reliably enough. It is substantially smaller than the pyrochlore structure. The perovskite structure has four atoms in the unit cell. FIG. 3 shows a unit cell of the perovskite structure. FIG. 4 shows a unit cell of the perovskite structure, which is shifted by ½, ½, ½ relative to the unit cell in FIG. 3. The smaller A cations are represented as solid circles, the larger B cations as shaded circles and the oxygen anions as empty circles. As can be seen from FIGS. 3 and 4, the perovskite structure is a cubic structure. In this structure, the larger B ions occupy the corners of the unit cube, the smaller A ions occupy the center and the O ions occupy its surface centers (FIG. 4). The structure can also be described in that the larger B ions and the O ions together form a cubic close-packed system where 1 in 4 of the octahedral sites are occupied with A ions. The B ions are each coordinated with 12 O ions in the form of a cubo-octahedron, and each O ion has four neighboring B ions and two neighboring A ions.

The following oxide compounds having perovskite structures are preferably used as the material for thermal barrier layers: ytterbium zirconate ($YbZrO_3$), ytterbium hafnate ($YbHfO_3$), calcium zirconate ($CaZrO_3$) and calcium hafnate ($CaHfO_3$). Ytterbium zirconate and ytterbium hafnate are particularly preferred in this case.

Also in the case of materials with perovskite structure for thermal barrier layers, it is not necessary for all of the cations of the A group the B group to be the same element. Here again, pseudoternary oxide compounds, for example with structural formula $Yb(Zr_{0.5}Hf_{0.5})O_3$ etc. are possible.

Like coating materials with pyrochlore structure, materials with perovskite structure also exhibit no phase transition from room temperature to high temperatures, if not to the melting temperature. For this reason, they are as advantageous as coating materials with pyrochlore structure.

Figure 5:
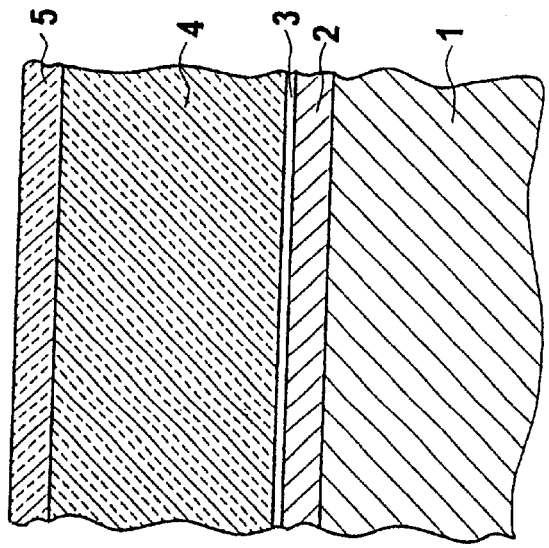
FIG. 5 is a fragmentary, diagrammatic, cross-sectional view of a turbine blade.

FIG. 5 represents a portion of a non-illustrated gas turbine blade or a heat shield element of a combustion chamber of a gas turbine. An adhesion promoter layer 2 is applied to a base body 1 which is formed of a superalloy, in particular based on nickel, cobalt or iron. The adhesion promoter layer 2 is formed of a metal/chromium/aluminum/yttrium (MCrAlY) alloy. The adhesion promoter layer 2 serves to ensure adhesion between a thermal barrier layer 4 and the base body 1. The aluminum and/or chromium contained in the adhesion promoter layer serves to form aluminum oxide/chromium oxide. A bonding layer 3, in particular a dense passive layer, of aluminum oxide or chromium oxide, respectively, is formed and protects the base body 1 from oxidation by acting as an oxygen barrier. The thermal barrier layer 4 is applied to the base body 1 preferably by atmospheric plasma spraying or by a PVD method, e.g. EB-PVD method. If atmospheric plasma spraying is used as the application method, the process parameters can be chosen in such a way as to set up the desired porosity in the thermal barrier layer 4. When an EB-PVD method is used, a columnar structure can be produced in the thermal barrier layer 4. In this case, the crystallite columns extend perpendicular to the surface of the base body 1. The thermal barrier layer 4 is formed, for example, of lanthanum hafnate. The thermal barrier layer 4 has a relatively loose microstructure. It contains pores or other voluminous defects. Even as a columnar microstructure, it is characterized by a relatively loose structural configuration. This loose structural configuration exhibits some degree of susceptibility to erosion in a hot gas flow. In order to provide protection against erosion phenomena of this type, the surface of the thermal barrier layer 4 may be fused to form a dense and compact protective layer 5, as represented herein. The protective layer 5 may, for example, be produced by laser fusion. It is likewise possible to apply the thermal barrier layer 4 directly to the base body 1. In this case, the alloy of the base body 1 will already be constructed in such a way that it is suitable for forming a bonding oxide, for example chromium oxide and/or aluminum oxide. This bonding oxide then forms the bonding layer 3.

I claim:

1. A device operable in a temperature environment in excess of about 1250° C., the device comprising:
   a substrate;
   a ceramic thermal barrier layer deposited on at least a portion of the substrate, the layer formed with a ternary or pseudoternary oxide having a pyrochlore structure of the formula $A_2B_2O_7$ and having pores or other voluminous defects.

2. The device of claim 1, wherein the temperature environment ranges from about room temperature to in excess of about 1250° C.

3. The device of claim 2, wherein the temperature environment ranges from about room temperature to in excess of about 2150° C.

4. The device of claim 1, wherein the substrate comprises a superalloy material.

5. The device of claim 4, wherein the superalloy material comprises a component of an engine.

6. The device of claim 5, wherein the engine component is a gas turbine blade.

7. The device of claim 1, wherein the substrate comprises a ceramic material.

8. The device of claim 1, wherein the layer is deposited as a generally continuous layer on the entire substrate.

9. The device of claim 8, wherein the generally continuous layer has a generally uniform depth.

10. The device of claim 1, wherein the layer is formed with a ternary oxide.

11. The device of claim 1, wherein the layer is formed with a pseudoternary oxide.

12. The device of claim 1, wherein the layer has voluminous defects other than pores.

13. The device of claim 12, wherein the voluminous defects are arranged generally horizontal to the substrate and/or generally vertical to the substrate.

14. The device of claim 1, wherein the voluminous defects are selected from the group consisting of intersplat cracks, intercolumnar gaps, intracolumnar gaps, and combinations thereof.

15. The device of claim 1, wherein the layer has pores and no other voluminous defects.

16. The device of claim 1, wherein the element A of the oxide is selected from the group consisting of Sm, Gd, Eu and combinations thereof and the element B of the oxide is selected from the group consisting of Zr, Hf and combinations thereof.

17. The device of claim 16, wherein the oxide is $Gd_2Zr_2O_7$.

18. The device of claim 16, wherein the oxide is $Sm_2Zr_2O_7$.

19. A device operable in a temperature environment in excess of about 1250° C., the device comprising:
   a substrate;
   a bondcoat deposited on at least a portion of the substrate; and
   a ceramic thermal barrier layer deposited on at least a portion of the bondcoat, the layer formed with a ternary or pseudoternary oxide having a generally pyrochlore structure of the formula of about $A_2B_2O_7$ and having pores or other voluminous defects.

20. The device of claim 19, wherein the element A of the oxide is selected from the group consisting of Sm Gd, Eu and combinations thereof and the element B of the oxide is selected from the group consisting of Zr, Hf and combinations thereof.

21. A method of forming a device operable in a temperature environment in excess of about 1250° C., the method comprising:

providing a substrate;

depositing a ceramic thermal barrier layer on at least a portion of the substrate, the layer formed with a ternary or pseudoternary oxide having a generally pyrochlore structure by plasma spraying or by a PVD method.

\* \* \* \* \*